United States Patent
Chang et al.

(10) Patent No.: US 9,349,733 B2
(45) Date of Patent: May 24, 2016

(54) GATE STRUCTURE HAVING SPACER WITH FLAT TOP SURFACE AND METHOD FOR FORMING THE SAME

(71) Applicant: TAIWAN SEMICONDUCTOR MANUFACTURING CO., LTD., Hsin-Chu (TW)

(72) Inventors: Jen-Chi Chang, Hsinchu (TW); Wen-Long Lee, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 14/318,079

(22) Filed: Jun. 27, 2014

(65) Prior Publication Data
US 2015/0380406 A1 Dec. 31, 2015

(51) Int. Cl.
| H01L 27/092 | (2006.01) |
| H01L 29/78 | (2006.01) |
| H01L 29/51 | (2006.01) |
| H01L 29/66 | (2006.01) |
| H01L 21/8238 | (2006.01) |
| H01L 21/311 | (2006.01) |

(52) U.S. Cl.
CPC ...... *H01L 27/0922* (2013.01); *H01L 21/31116* (2013.01); *H01L 21/823842* (2013.01); *H01L 21/823871* (2013.01); *H01L 29/517* (2013.01); *H01L 29/6656* (2013.01); *H01L 29/66545* (2013.01); *H01L 29/7848* (2013.01)

(58) Field of Classification Search
CPC ............ H01L 29/66545; H01L 27/088; H01L 29/518; H01L 27/092; H01L 27/0922; H01L 29/7848; H01L 21/823842; H01L 29/517
USPC .................. 257/369, 401, 368, 192; 438/283
See application file for complete search history.

(56) References Cited

U.S. PATENT DOCUMENTS

| 6,165,880 | A | * | 12/2000 | Yaung | H01L 21/28525 |
| | | | | | 257/E21.166 |
| 7,075,150 | B2 | * | 7/2006 | Boyd et al. | 257/347 |
| 7,098,114 | B1 | * | 8/2006 | Syau et al. | 438/320 |
| 8,853,010 | B2 | * | 10/2014 | Park et al. | 438/147 |
| 8,916,936 | B2 | * | 12/2014 | Lee et al. | 257/368 |
| 2013/0099320 | A1 | * | 4/2013 | Lee et al. | 257/368 |
| 2013/0149821 | A1 | * | 6/2013 | Yeh et al. | 438/199 |
| 2014/0048884 | A1 | * | 2/2014 | Breyta et al. | 257/368 |

* cited by examiner

*Primary Examiner* — Evan Pert
*Assistant Examiner* — Damon Hillman
(74) *Attorney, Agent, or Firm* — Birch, Stewart, Kolasch & Birch, LLP

(57) ABSTRACT

A semiconductor structure and a method for forming the same are provided. The semiconductor structure includes a first gate structure formed over a substrate. The semiconductor structure includes a first spacer formed on a sidewall of the first gate structure. In addition, a top surface of the first spacer is parallel to a top surface of the substrate.

20 Claims, 6 Drawing Sheets

GATE STRUCTURE HAVING SPACER WITH FLAT TOP SURFACE AND METHOD FOR FORMING THE SAME

BACKGROUND

Semiconductor devices are used in a variety of electronic applications, such as personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

One of the important drivers for increased performance in computers is the higher levels of integration of circuits. This is accomplished by miniaturizing or shrinking device sizes on a given chip. Tolerances play an important role in being able to shrink dimensions on a chip.

As technology nodes shrink, in some integrated circuit (IC) designs, there has been a desire to replace the typically polysilicon gate with a metal gate to improve device performance with the decreased feature sizes. One process of forming the metal gate is called a "gate last" process. In a "gate last" process, the metal gate is fabricated last, which allows for a reduced number of subsequent processes.

However, although existing "gate last" processes have been generally adequate for their intended purposes, as device scaling-down continues, they have not been entirely satisfactory in all respects.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
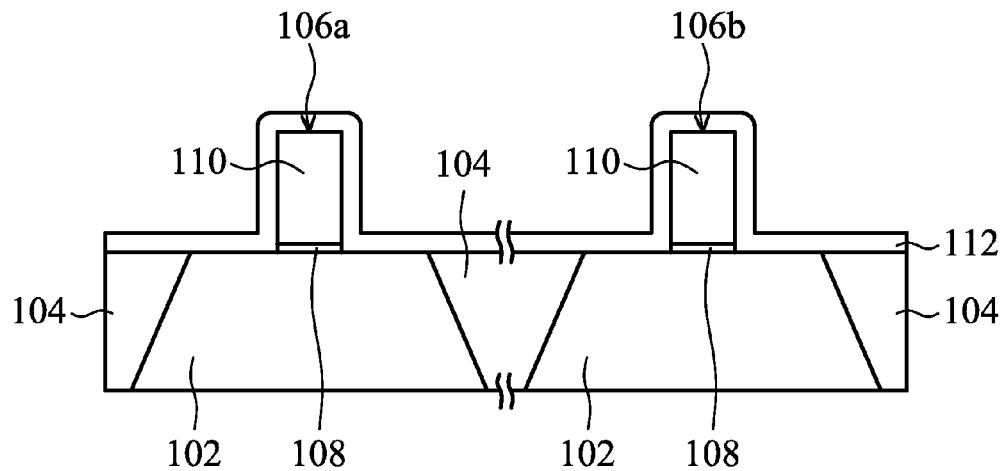
FIGS. 1A to 1L are cross-sectional representations of various stages of forming a semiconductor structure in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments of a semiconductor device structure are provided in accordance with some embodiments of the disclosure. The semiconductor device structure may include a gate structure and spacers formed on sidewalls of the gate structure. FIGS. 1A to 1L are cross-sectional representations of various stages of forming a semiconductor structure in accordance with some embodiments.

As shown in FIG. 1A, a substrate 102 is provided in accordance with some embodiments. Substrate 102 may be a semiconductor wafer such as a silicon wafer. Alternatively or additionally, substrate 102 may include elementary semiconductor materials, compound semiconductor materials, and/or alloy semiconductor materials. Examples of the elementary semiconductor materials may be, but are not limited to, crystal silicon, polycrystalline silicon, amorphous silicon, germanium, and/or diamond. Examples of the compound semiconductor materials may be, but are not limited to, silicon carbide, gallium arsenic, gallium phosphide, indium phosphide, indium arsenide, and/or indium antimonide. Examples of the alloy semiconductor materials may be, but are not limited to, SiGe, GaAsP, AlInAs, AlGaAs, GaInAs, GaInP, and/or GaInAsP.

In addition, substrate 102 may include structures such as doped regions, interlayer dielectric (ILD) layers, and/or conductive features. Furthermore, substrate 102 may further include single or multiple material layers to be patterned. For example, the material layers may include a silicon layer, a dielectric layer, and/or a doped poly-silicon layer.

In some embodiments, substrate 102 includes a plurality of isolation features 104, such as shallow trench isolation (STI) features or local oxidation of silicon (LOCOS) features. Isolation features 104 are configured to isolate various elements formed in and/or upon substrate 102.

A first dummy gate substrate 106a and a second dummy gate structure 106b are formed over substrate 102, as shown in FIG. 1A in accordance with some embodiments. In some embodiments, first dummy gate structure 106a and second dummy gate structure 106b respectively include a dummy gate dielectric layer 108 and a dummy gate electrode layer 110. In some embodiments, dummy gate dielectric layer 108 is made of high-k dielectric materials, such as metal oxides, metal nitrides, metal silicates, transition metal-oxides, transition metal-nitrides, transition metal-silicates, or oxynitrides of metals. Examples of the high-k dielectric material include, but are not limited to, hafnium oxide ($HfO_2$), hafnium silicon oxide (HfSiO), hafnium silicon oxynitride (HfSiON), hafnium tantalum oxide (HfTaO), hafnium titanium oxide (HfTiO), hafnium zirconium oxide (HfZrO), silicon nitride, silicon oxynitride, zirconium oxide, titanium oxide, aluminum oxide, hafnium dioxide-alumina ($HfO_2$—$Al_2O_3$) alloy, or other applicable dielectric materials. In some embodiments, dummy gate electrode layer 112 is made of polysilicon.

First dummy gate structure 106a and second dummy gate structure 106b may be formed by a procedure including deposition, photolithography patterning, and etching processes. The deposition processes may include chemical vapor deposition (CVD), physical vapor deposition (PVD), atomic layer deposition (ALD), high density plasma CVD (HDPCVD), metal organic CVD (MOCVD), or plasma enhanced CVD (PECVD). The photolithography patterning processes may include photoresist coating (e.g., spin-on coating), soft baking, mask aligning, exposure, post-exposure baking, developing the photoresist, rinsing, drying (e.g., hard baking), and/or other applicable processes. The etching processes may include dry etching, wet etching, and/or other etching methods (e.g., reactive ion etching).

It should be noted that first dummy gate structure 106a and second dummy gate structure 106b may be adjacent to each other or other structures may be formed between first dummy gate structure 106a and second dummy gate structure 106b, and the scope of the disclosure is not intended to be limiting.

After first dummy gate structure 106a and second dummy gate structure 106b are formed on substrate 102, a dielectric layer 112 is formed to cover first dummy gate structure 106a and second dummy gate structure 106b over substrate 102, as shown in FIG. 1A in accordance with some embodiments. Dielectric layer 112 may be made of silicon nitride, silicon oxide, silicon carbide, silicon oxynitride, or other applicable materials. Dielectric layer 112 may be formed by chemical vapor deposition (CVD), physical vapor deposition (PVD), atomic layer deposition (ALD), high density plasma CVD (HDPCVD), metal organic CVD (MOCVD), or plasma enhanced CVD (PECVD).

Figure 1B:
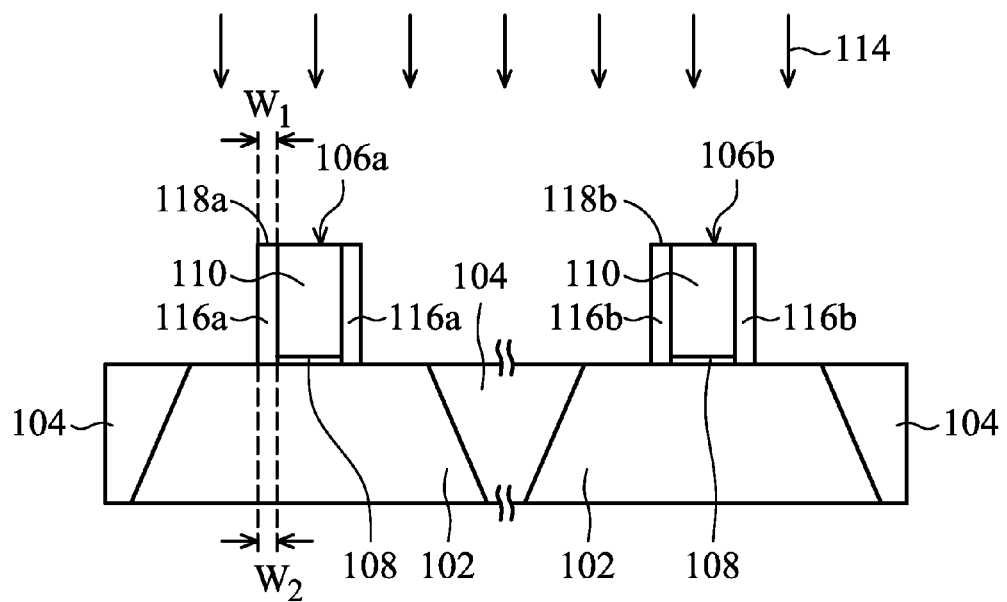

Next, a dry etching process 114 is performed to form first spacers 116a and second spacers 116b, as shown in FIG. 1B in accordance with some embodiments. In some embodiments, dry etching process 114 includes using an etching gas, and the etching gas comprises helium (He), argon (Ar), hydrogen bromide (HBr), nitrogen ($N_2$), methane ($CH_4$), tetrafluoromethane ($CF_4$), monofluoromethane ($CH_3F$), difluoromethane ($CH_2F_2$), trifluoromethane ($CHF_3$), oxygen ($O_2$), or a combination thereof (ok). In some embodiments, dry etching process 114 includes using methane ($CH_4$), tetrafluoromethane ($CF_4$), monofluoromethane ($CH_3F$), difluoromethane ($CH_2F_2$), or trifluoromethane ($CHF_3$) at a temperature in a range from about 50° C. to about 60° C.

Since first spacers 116a and second spacers 116b are formed by dry etching process 114, instead of by a wet etching process, the sizes and shapes of first spacers 116a and second spacers 116b can be adjusted as required. For example, first spacers 116a and second spacers 116b may have relatively large and flat top surfaces, compared to those formed by a wet etching process. In addition, the sizes and shapes of first spacers 116a may be substantially the same as those of second spacers 116b. In some embodiments, first spacers 116a and second spacers are rectangular spacers.

In some embodiments, a top surface 118a of first spacer 116a and a top surface 118b of second spacer 116b are parallel to the top surface of substrate 102. In addition, top surface 118a of first spacer 116a and top surface 118b of second spacer 116b are substantially level with the top surface of substrate 102 in accordance with some embodiments. In some embodiments, first spacers 116a and second spacers 116b respectively have two straight sidewalls vertical with the top surface of substrate 102. In some embodiments, first spacers 116a and second spacers 116b are each in the shape of a rectangle.

In some embodiments, top surface 118a of first spacer 116a has a first width $W_1$ in a range from about 7 nm to about 10 nm. If first width $W_1$ of first spacer 116a is too small, risks of leakage of the device increase. On the other hand, if first width $W_1$ of first spacer 116a is too large, the deposition of inter-layer dielectric layer in subsequent processes may become more difficult. In some embodiments, a bottom surface of first spacer 116a has a second width $W_2$ substantially the same as first width $W_1$ of top surface 118a of first spacer 116a.

Figure 1C:
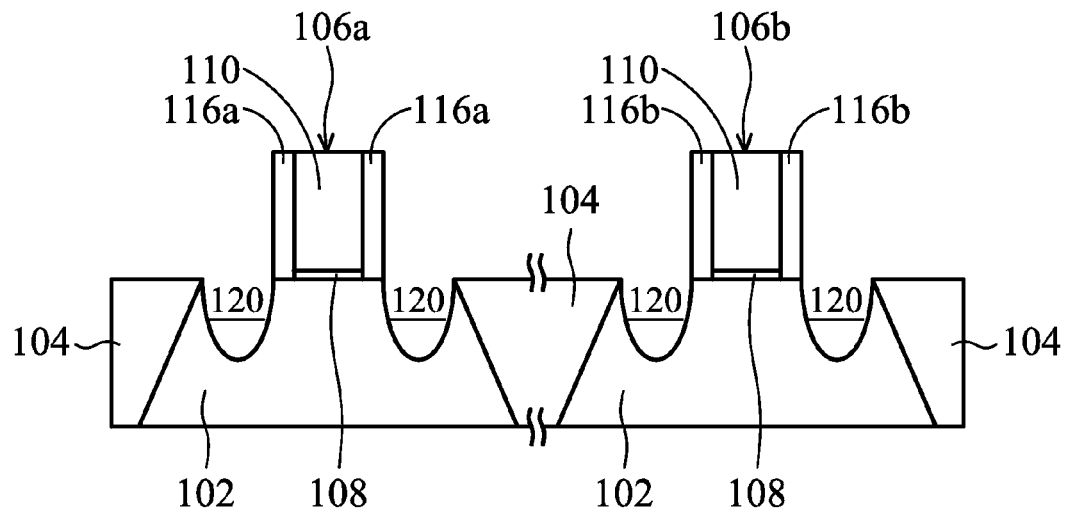

After first spacers 116a and second spacers 116b are formed, first source and drain regions and second source and drain regions are formed in substrate 102 in accordance with some embodiment. More specifically, substrate 102 is recessed to form recesses 120, as shown in FIG. 1C in accordance with some embodiments. In some embodiments, recesses 120 are aligned with first spacer 116a and second spacers 116b. Recesses 120 may be formed by a dry etching process.

Figure 1D:
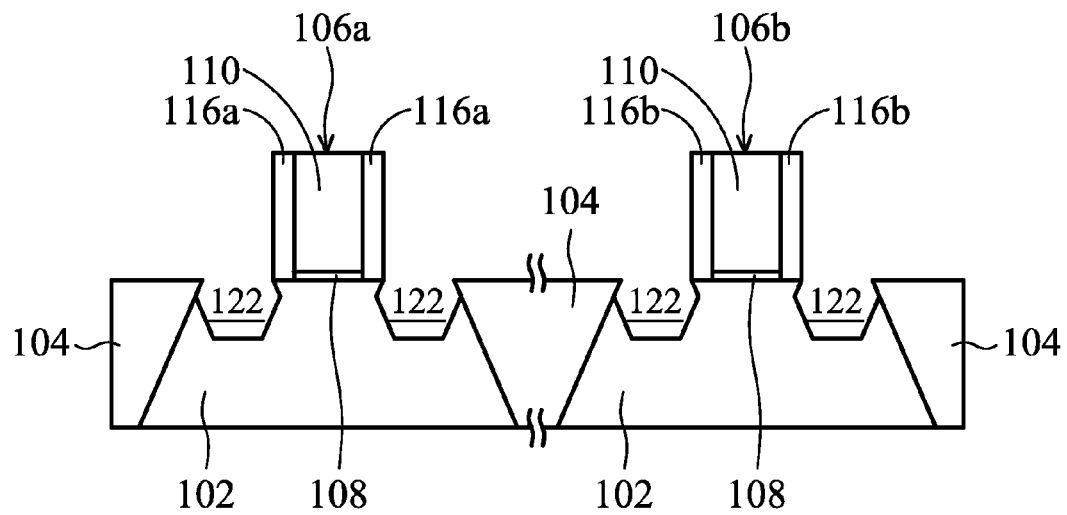
Figure 1E:
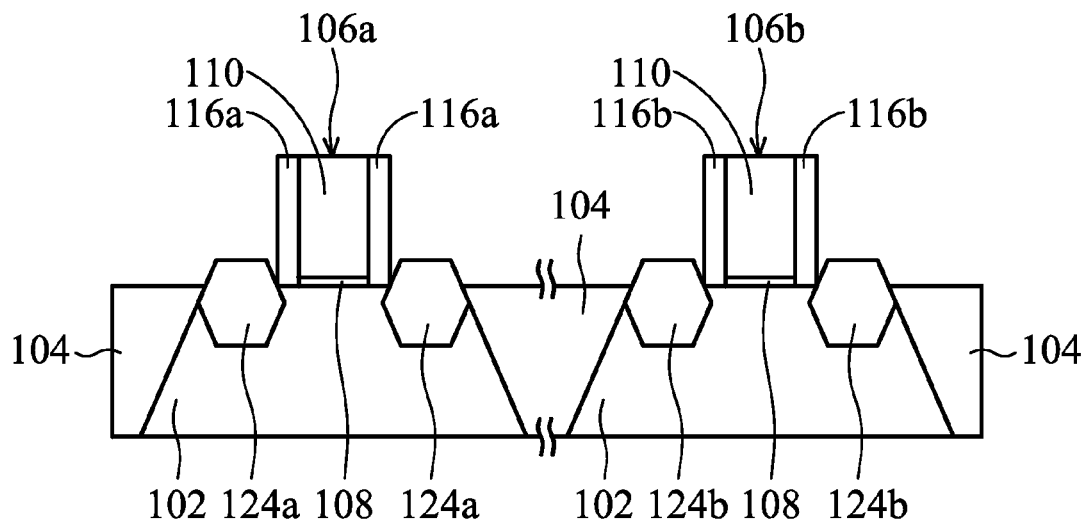

Afterwards, recesses 120 are further etched to form enlarged recesses 122, as shown in FIG. 1D in accordance with some embodiments of the disclosure. In some embodiments, enlarged recesses 122 are aligned with first spacers 116a and second spacers 116b. Enlarged recesses 122 may be formed by a wet etching process.

Next, a semiconductor material is formed in enlarged recesses 122 to form a first strained source and drain (SSD) structure 124a and a second strained source and drain structure 124b. More specifically, first strained source and drain structure 124a is formed adjacent to first spacers 116a, and second strained source and drain structure 124b is formed adjacent to second spacers 116b. In some embodiments, silicon germanium (SiGe) is deposited in the recesses 122 of substrate 102 to form SiGe source and drain structure. First strained source and drain structure 124a and second strained source and drain structure 124b may alternatively be referred to as raised source and drain regions.

In some embodiments, first strained source and drain structure 124a and second strained source and drain structure 124b are formed by an epitaxial (epi) process. The epi process may include a selective epitaxy growth (SEG) process, CVD deposition techniques (e.g., vapor-phase epitaxy (VPE) and/or ultra-high vacuum CVD (UHV-CVD)), molecular beam epitaxy, or other applicable epi processes. The epi process may use gaseous and/or liquid precursors, which may interact with the composition of substrate 102. The deposited semiconductor material may be different from substrate 102. Accordingly, a channel region is strained or stressed to improve carrier mobility of the device and enhance device performance.

In addition, first strained source and drain structure 124a and second strained source and drain structure 124b may be in-situ doped or undoped during the epi process. If first strained source and drain structure 124a and second strained source and drain structure 124b are undoped during the epi process, they may be doped in subsequent processes. For example, first strained source and drain structure 124a and second strained source and drain structure 124b may be doped by an ion implantation process, plasma immersion ion implantation (PIII) process, gas and/or solid source diffusion process, or other applicable processes. In addition, an annealing process may further be processed to first strained source and drain structure 124a and second strained source and drain structure 124b, such as a rapid thermal annealing process. However, it should be noted that, although first strained source and drain structure 124a and second strained source and drain structure 124b are shown in FIG. 1C to 1L, they are merely examples, and the source and drain regions of the disclosure are not limited to strained source and drain structures.

Figure 1F:
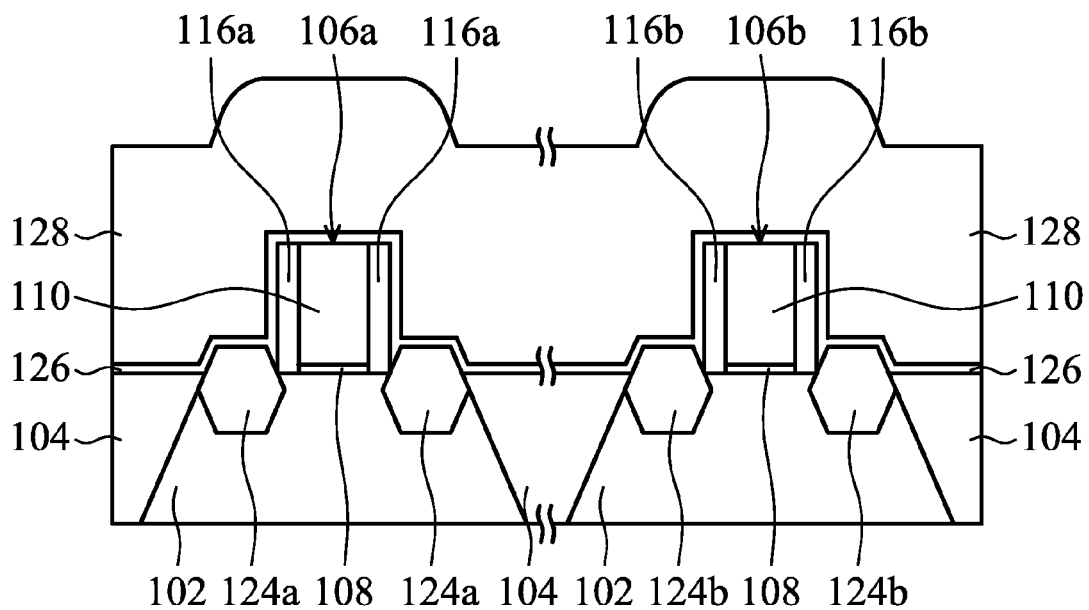

After first strained source and drain structure 124a and second strained source and drain structure 124b are formed, a contact etch stop layer (CESL) 126 is formed to cover first dummy gate structure 106a and second dummy gate structure 106b over substrate 102, as shown in FIG. 1F in accordance with some embodiments. In some embodiments, contact etch stop layer 126 is made of silicon nitride, silicon oxynitride, and/or other applicable materials. Contact etch stop layer 126 may be formed by plasma enhanced CVD, low pressure CVD, ALD, or other applicable processes.

After contact etch stop layer 126 is formed, an inter-layer dielectric (ILD) layer 128 is formed on contact etch stop layer 126 over substrate 102 in accordance with some embodiments. Inter-layer dielectric layer 128 may include multilayers made of multiple dielectric materials, such as silicon oxide, silicon nitride, silicon oxynitride, tetraethoxysilane (TEOS), phosphosilicate glass (PSG), borophosphosilicate glass (BPSG), low-k dielectric material, and/or other applicable dielectric materials. Examples of low-k dielectric materials include, but are not limited to, fluorinated silica glass (FSG), carbon doped silicon oxide, amorphous fluorinated carbon, parylene, bis-benzocyclobutenes (BCB), or polyimide. Inter-layer dielectric layer 128 may be formed by chemical vapor deposition (CVD), physical vapor deposition, (PVD), atomic layer deposition (ALD), spin-on coating, or other applicable processes.

Figure 1G:
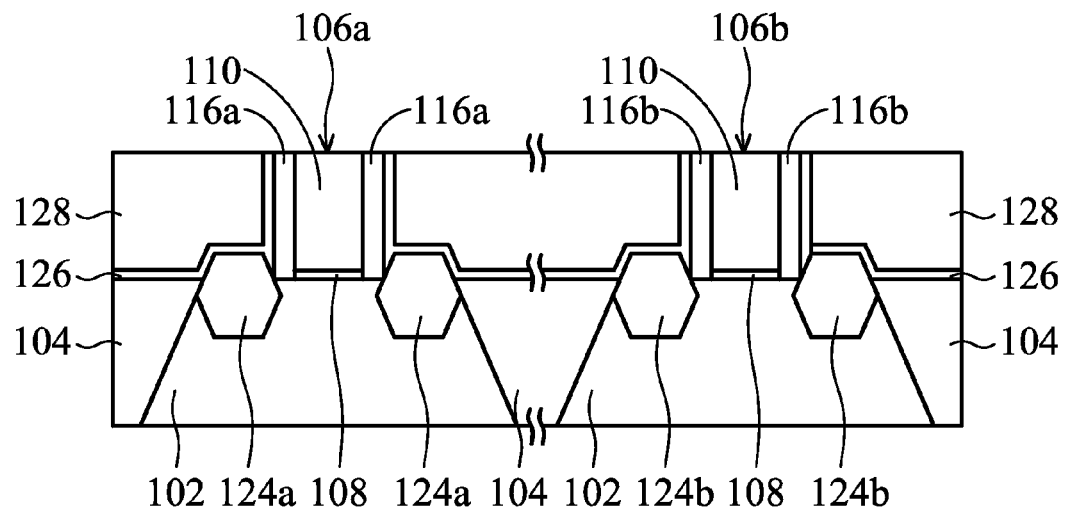

Afterwards, a polishing process is performed to inter-layer dielectric layer 128, as shown in FIG. 1G in accordance with some embodiments. In some embodiments, inter-layer dielectric layer 128 is planarized by a chemical mechanical polishing (CMP) process until the top surfaces of first dummy gate structure 106a and second dummy gate structure 106b are exposed.

Figure 1H:
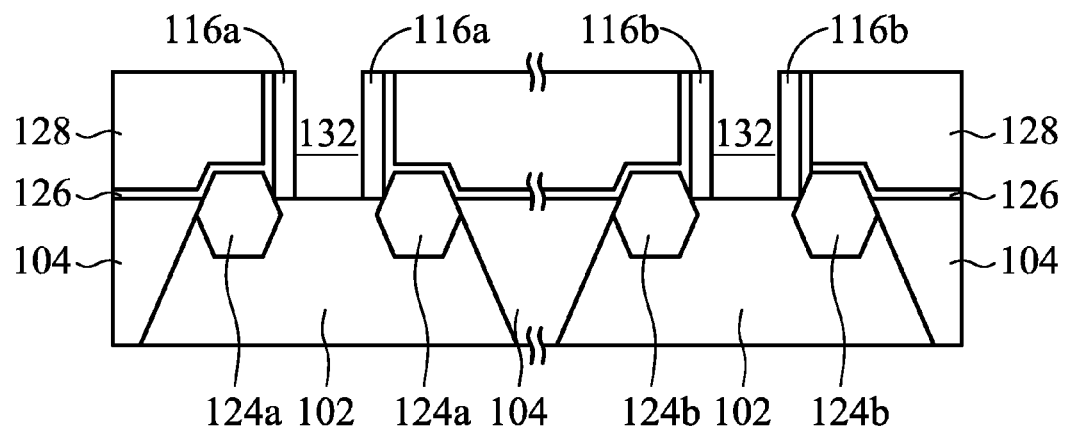

After the polishing process is performed, first dummy gate structure 106a is replaced by a first gate structure 130a, and second dummy gate structure 106b is replaced by a second gate structure 130b. More specifically, first dummy gate structure 106a and second dummy gate structure 106b are removed to form trenches 132, as shown in FIG. 1H in accordance with some embodiments.

Figure 1I:
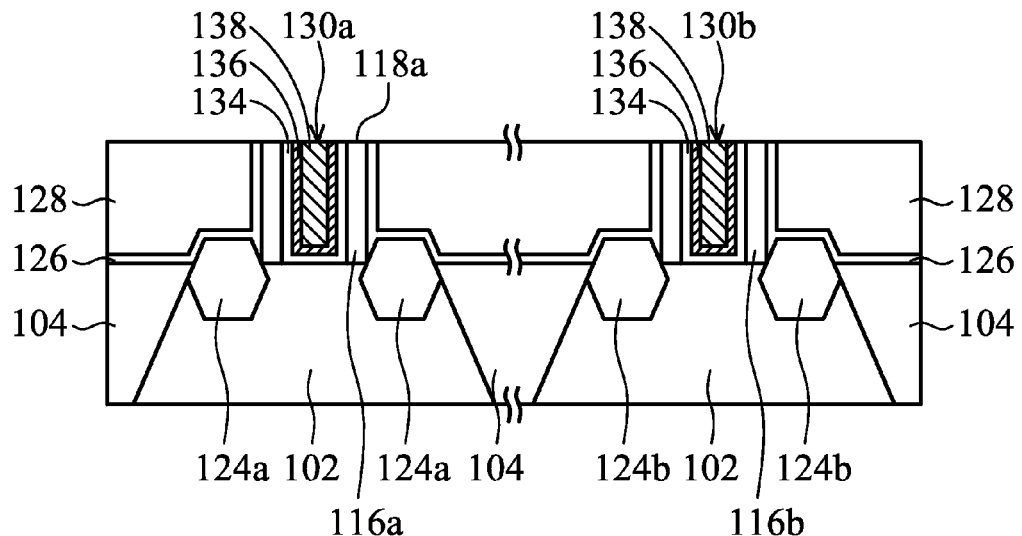

Dummy gate electrode layer 110 may be removed by a first etching process, and dummy gate dielectric layer 108 may be removed by a second etching process after the first etching process is performed. After dummy gate electrode layer 110 and dummy gate dielectric layer 108 are removed, first gate structure 130a and second gate structure 130b are formed in trenches 132, as shown in FIG. 1I in accordance with some embodiments.

In some embodiments, first gate structure 130a and second gate structure 130b respectively include a high-k dielectric layer 134, a work function metal layer 136, and a metal gate electrode layer 138. In some embodiments, high-k dielectric layer 134 is made of high k dielectric materials such as hafnium oxide ($HfO_2$), hafnium silicon oxide (HfSiO), hafnium silicon oxynitride (HfSiON), hafnium tantalum oxide (HfTaO), hafnium titanium oxide (HfTiO), hafnium zirconium oxide (HfZrO), metal oxides, metal nitrides, metal silicates, transition metal oxides, transition metal nitrides, transition metal silicates, oxynitrides of metals, metal aluminates, zirconium silicate, zirconium aluminate, silicon oxide, silicon nitride, silicon oxynitride, zirconium oxide, titanium oxide, aluminum oxide, or hafnium dioxide-alumina ($HfO_2$—$Al_2O_3$) alloy.

Work function metal layer 136 is formed over high-k dielectric layer 134 in accordance with some embodiments. Work function metal layer 136 is tuned to have a proper work function. For example, if a P-type work function metal (P-metal) for a PMOS device is desired, P-type work function materials may be used. Examples of the P-type work function materials include, but are not limited to, titanium nitride (TiN), tungsten nitride (WN), tungsten (W), ruthenium (Ru), palladium (Pd), platinum (Pt), cobalt (Co), nickel (Ni), conductive metal oxides, and/or other applicable materials.

On the other hand, if an N-type work function metal (N-metal) for NMOS devices is desired, N-type metal materials may be used. Examples of the N-type work function materials include, but are not limited to, titanium aluminide (TiAl), titanium aluminum nitride (TiAlN), carbo-nitride tantalum (TaCN), hafnium (Hf), zirconium (Zr), titanium (Ti), tantalum (Ta), aluminum (Al), metal carbides (e.g., hafnium carbide (HfC), zirconium carbide (ZrC), titanium carbide (TiC), aluminum carbide (AlC)), aluminides, and/or other applicable materials.

In some embodiments, first gate structure 130a includes a P-type metal work function layer, and second gate structure 130b includes a N-type metal work function layer. In addition, it should be noted that work function metal layer 136 may be a single layer or may include multiple layers made of various work function materials, although only one layer is shown in FIG. 1I, and the scope of the disclosure is not intended to be limiting.

Metal gate electrode layer 138 is formed over work function metal layer 136 in accordance with some embodiments. In some embodiments, metal gate electrode layer 138 is made of a conductive material, such as aluminum, copper, tungsten, titanium, tantalum, titanium nitride, tantalum nitride, nickel silicide, cobalt silicide, TaC, TaSiN, TaCN, TiAl, TiAlN, or other applicable materials. Gate dielectric layer 134, work function metal layer 136, and metal gate electrode layer 138 may be formed by any applicable process to any applicable thickness.

It should be noted that additional layers may be formed above and/or below gate dielectric layer 134, work function metal layer 136, and metal gate electrode layer 138, such as liner layers, interface layers, seed layers, adhesion layers, barrier layers, or the like. In addition, gate dielectric layer 134, work function metal layer 136, and metal gate electrode layer 138 may include one or more materials and/or one or more layers.

Figure 1J:
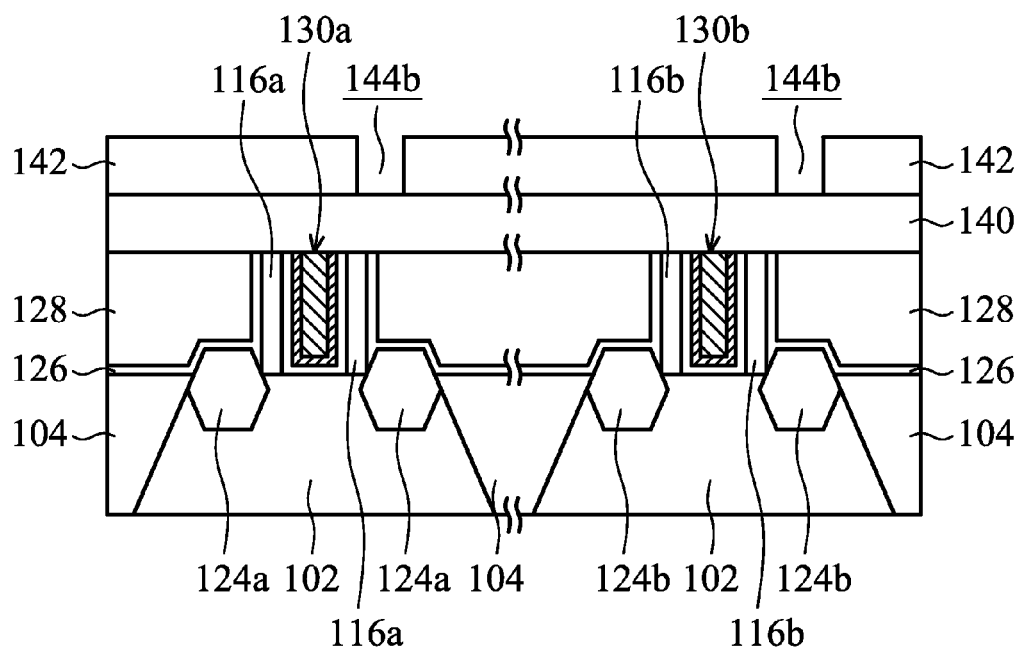

Next, a dielectric layer 140 is formed on inter-layer dielectric layer 128, first gate structure 130a, and second gate structure 130b, as shown in FIG. 1J in accordance with some embodiments. In some embodiments, dielectric layer 140 is made of silicon oxide, silicon nitride, silicon oxynitride, or other applicable dielectric materials similar to, or the same as, inter-layer dielectric layer 128. Dielectric layer 140 may be formed by a CVD process.

Afterwards, a photoresist layer 142 is formed over dielectric layer 140, as shown in FIG. 1J in accordance with some embodiments. Photoresist layer 142 has a first opening 144a and a second opening 144b. Since top surface 118a of first spacer 116a has a relatively large width, tolerance for aligning the openings in photoresist layer 142 increases. For example, in some embodiments, first opening 144a c overlaps with both first spacer 116a and first strained source and drain structure 124a, while second opening 144b only overlaps with strained source and drain structure 124b but does not overlap with second spacer 116b.

Figure 1K:
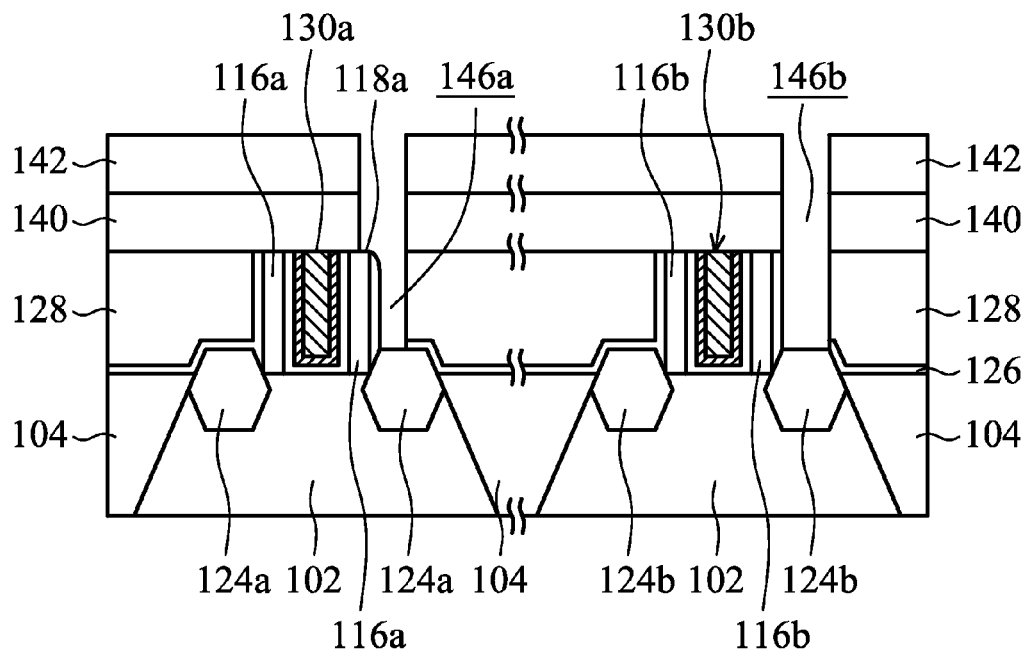

Next, an etching process is performed to remove the portions of inter-layer dielectric layer 128 and dielectric layer 142 below first opening 144a and second opening 144b of photoresist layer 142, as shown in FIG. 1K in accordance with some embodiments. A first contact trench 146a and a second contact trench 146b are therefore formed. In some embodiments, the etching process is a wet etching process. The widths of first contact trench 146a and second contact trench 146b may be adjusted as required. As shown in FIG. 1K, although a portion of first spacer 116a is located below first opening 144a, first spacer 116a is not removed by the etching process.

Figure 1L:
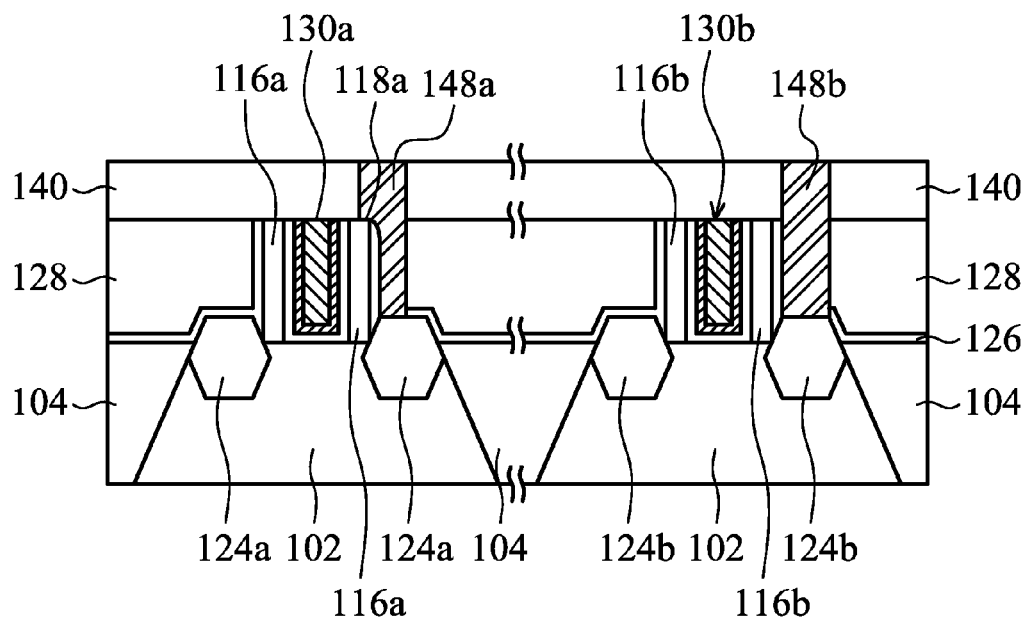

After first contact trench 146a and second contact trench 146b are formed, first contact trench 146a and second contact trench 146b are filled with conductive materials to form a first contact 148a and a second contact 148b respectively, as shown in FIG. 1L in accordance with some embodiments. More specifically, first contact 148a is formed on first strained source and drain structure 124a adjacent to first spacer 116a, and second contact 148b is formed on second strained source and drain structure 124b adjacent to second spacer 116b.

As described above, although a portion of first spacer 116a is located below first opening 144a, first spacer 116a is not removed by the etching process for forming first contact trench 146a. Therefore, first contact 148a formed in first contact trench 146a has a portion in direct contact with top surface 118a of first spacer 116a. On the other hand, second contact 148b is not in direct contact with the top surface of second spacer 116b. Accordingly, first contact 148a overlaps with first spacer 116a, but second contact 148b does not overlap with second spacer 116b.

In some embodiments, first contact 148a and second contact 148b are made of conductive materials such as aluminum (Al), copper (Cu), tungsten (W), titanium (Ti), tantalum (Ta), titanium nitride (TiN), tantalum nitride (TaN), nickel silicide (NiS), cobalt silicide (CoSi), tantalum carbide (TaC), tantalum silicide nitride (TaSiN), tantalum carbide nitride (TaCN), titanium aluminide (TiAl), titanium aluminide nitride (TiAlN), other applicable conductive materials, or a combination thereof.

As described previously, dry etching process 114 is performed to form the spacers, such as first spacers 116a and second spacers 116b, on the sidewalls of the dummy gate structures, such as first dummy gate structure 106a and second gate structure 106b. The spacers formed by dry etching process 114 can have a relatively large and flat top surface, compared to those formed by a wet etching process. The spacers having the relatively large and flat top surface (e.g. top surface 118a of first spacer 116a) enable the formation of the contact formed in the subsequent process to have a larger tolerance for alignment. For example, when first contact 148a is formed on first strained source and drain structure 124a adjacent to first gate 130a, first spacer 116a can separate first contact 148a and first gate 130a. Therefore, even if first contact 148a is slightly shifted such that it is not precisely aligned with first strained source and drain structure 124a, the electrical short between first contact 148a and first gate 130a can still be avoided by first spacer 116a. That is, first spacer 116a can be seen as a protection to prevent first contact 148a and first gate 130a from shorting.

Embodiments for forming a semiconductor structure are provided. The semiconductor structure includes a gate structure having a spacer located on its sidewall. The spacer is formed by performing a dry etching process. The spacer formed by the dry etching process can have a relatively flat a large top surface. The spacer can be used to separate the gate structure and a contact formed adjacent to the gate structure. Therefore, the tolerance for the alignment of the contact is increased.

In some embodiments, a semiconductor structure is provided. The semiconductor structure includes a first gate structure formed over a substrate and a first spacer formed on a sidewall of the first gate structure. In addition, a top surface of the first spacer is parallel to a top surface of the substrate.

In some embodiments, a semiconductor structure is provided. The semiconductor structure includes a first gate structure and a second gate structure formed over a substrate. The semiconductor structure further includes a first spacer formed on a sidewall of the first gate structure and a second spacer formed on a sidewall of the second gate structure. The semiconductor structure further includes a first strained source and drain structure formed in the substrate adjacent to the first spacer and a second strained source and drain structure formed in the substrate adjacent to the second spacer. The semiconductor structure further includes a first contact formed on the first strained source and drain structure and a second contact formed on the second strained source and drain structure. In addition, a top surface of the first spacer is parallel to a top surface of the substrate, and a portion of the first contact is in direct contact with the top surface of the first spacer.

In some embodiments, a method for forming a semiconductor structure is provided. The method for forming a semiconductor structure includes forming a first dummy gate structure over a substrate and forming a dielectric layer to cover the first dummy gate structure over the substrate. The method for forming a semiconductor structure further includes performing an etching process to form a rectangular first spacer on the sidewall of the first dummy gate structure. The method for forming a semiconductor structure further includes forming a first source and drain structure in the substrate adjacent to the rectangular first spacer. The method for forming a semiconductor structure further includes replacing the first dummy gate structure by a first gate structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:
    a first gate structure formed over a substrate;
    a first spacer formed on a sidewall of the first gate structure, wherein a top surface of the first spacer is parallel to a top surface of the substrate;
    a source and drain structure formed in the substrate adjacent to the first spacer;
    a first contact formed on the source and drain structure, wherein a portion of the first contact is in direct contact with the top surface of the first spacer; and
    a contact etch stop layer along an outer sidewall of the first spacer, wherein the outer sidewall of the first spacer is separate from the first contact by the contact etch stop layer, and another portion of the first contact is in direct contact with a top and an outer sidewall of the contact etch stop layer,
    wherein the top surface of the first spacer is level with a top surface of a gate electrode layer of the first gate structure.

2. The semiconductor structure as claimed in claim 1, wherein a top of the contact etch stop layer is not above the top surface of the first spacer.

3. The semiconductor structure as claimed in claim 1, wherein the first spacer has two straight sidewalls vertical with a top surface of the substrate.

4. The semiconductor structure as claimed in claim 1, wherein the first spacer is in a shape of a rectangle.

5. The semiconductor structure as claimed in claim 1, wherein the top surface of the first spacer has a first width in a range from about 7 nm to about 10 nm.

6. The semiconductor structure as claimed in claim 1, wherein the top surface of the first spacer has a first width and a bottom surface of the first spacer has a second width the same as the first width.

7. The semiconductor structure as claimed in claim 1, wherein the source and drain structure is a strained source and drain structure.

8. The semiconductor structure as claimed in claim 1, wherein the first gate structure comprises a high-k dielectric layer, a metal work function layer, and a metal gate electrode layer.

9. A semiconductor structure, comprising:
a first gate structure and a second gate structure formed over a substrate;
a first spacer formed on a sidewall of the first gate structure and a second spacer formed on a sidewall of the second gate structure;
a first source and drain structure formed in the substrate adjacent to the first spacer and a second source and drain structure formed in the substrate adjacent to the second spacer;
a first contact formed on the first source and drain structure and a second contact formed on the second source and drain structure, wherein a top surface of the first spacer is parallel to a top surface of the substrate, and a portion of the first contact is in direct contact with the top surface of the first spacer;
a first contact formed on the first source and drain structure, wherein a portion of the first contact is in direct contact with the top surface of the first spacer; and
a first contact etch stop layer along an outer sidewall of the first spacer, wherein the outer sidewall of the first spacer is separate from the first contact by the first contact etch stop layer, and another portion of the first contact is in direct contact with a top and an outer sidewall of the first contact etch stop layer,
wherein the top surface of the first spacer is level with a top surface of a gate electrode layer of the first gate structure.

10. The semiconductor structure as claimed in claim 9, wherein a top surface of the second spacer is parallel to a top surface of the substrate, and the second contact is not in direct contact with the top surface of the second spacer.

11. The semiconductor structure as claimed in claim 9, wherein the first contact is overlapped with the first spacer and the second contact is not overlapped with the second spacer.

12. The semiconductor structure as claimed in claim 9, wherein the first spacer and the second spacer are respectively in a shape of a rectangle.

13. The semiconductor structure as claimed in claim 9, wherein the top surface of the first spacer has a first width in a range from about 7 nm to about 10 nm.

14. The semiconductor structure as claimed in claim 9, wherein the first gate structure comprises a P-type metal work function layer, and the second gate structure comprises a N-type metal work function layer.

15. A method for forming a semiconductor structure, comprising:
forming a first dummy gate structure over a substrate;
forming a dielectric layer to cover the first dummy gate structure over the substrate;
performing an etching process to form a rectangular first spacer on a sidewall of the first dummy gate structure;
forming a first source and drain structure in the substrate adjacent to the rectangular first spacer;
after the step of performing the etching process to form the rectangular first spacer on the sidewall of the first dummy gate structure, forming a first contact etch stop layer along an outer sidewall of the first spacer and level with a top surface of the first spacer;
after the steps of forming the first spacer and forming the first contact etch stop layer along the outer sidewall of the first spacer and level with the top surface of the first spacer, replacing the first dummy gate structure by a first gate structure such that the top surface of the first spacer is level with a top surface of a gate electrode layer of the first gate structure; and
forming a first contact connected to the first source and drain structure such that a portion of the first contact is in direct contact with the top surface of the first spacer, the outer sidewall of the first spacer is separate from the first contact by the first contact etch stop layer, and another portion of the first contact is in direct contact with a top and an outer sidewall of the first contact etch stop layer.

16. The method for forming a semiconductor structure as claimed in claim 15, wherein the rectangular first spacer is etched by a dry etching process.

17. The method for forming a semiconductor structure as claimed in claim 15, wherein the etching process comprises using an etching gas, and the etching gas comprises helium (He), argon (Ar), hydrogen bromide (HBr), nitrogen (N2), methane (CH4), tetrafluoromethane (CF4), monofluoromethane (CH3F), difluoromethane (CH2F2), trifluoromethane (CHF3), oxygen (O2), or a combination thereof.

18. The method for forming a semiconductor structure as claimed in claim 15, wherein a top surface of the rectangular spacer has a first width in a range from 7 nm to about 10 nm.

19. The method for forming a semiconductor structure as claimed in claim 15, further comprising:
forming a second dummy gate structure over the substrate;
forming the dielectric layer to cover the second dummy gate structure over the substrate;
performing the etching process to form a rectangular second spacer on a sidewall of the second dummy gate structure;
forming a second source and drain structure in the substrate adjacent to the rectangular second spacer;
replacing the second dummy gate structure by a second gate structure; and
forming a second contact connected to the second source and drain structure.

20. The method for forming a semiconductor structure as claimed in claim 19, wherein a top surface of the first spacer is parallel to a top surface of the substrate, while a top surface of the second spacer is parallel to the top surface of the substrate and the second contact is not in direct contact with the top surface of the second spacer.

* * * * *